(12) United States Patent
Hsu

(10) Patent No.: US 8,900,950 B2
(45) Date of Patent: Dec. 2, 2014

(54) TRENCH POWER MOSFET STRUCTURE WITH HIGH CELL DENSITY AND FABRICATION METHOD THEREOF

(75) Inventor: Hsiu-Wen Hsu, Hsinchu County (TW)

(73) Assignee: Great Power Semiconductor Corp., New Taipei (TW)

( * ) Notice: Subject to any disclaimer, the term of this patent is extended or adjusted under 35 U.S.C. 154(b) by 203 days.

(21) Appl. No.: 13/425,365

(22) Filed: Mar. 20, 2012

(65) Prior Publication Data

US 2012/0256258 A1 Oct. 11, 2012

(30) Foreign Application Priority Data

Apr. 11, 2011 (TW) ................ 100112491 A

(51) Int. Cl.
*H01L 29/78* (2006.01)
*H01L 21/336* (2006.01)
*H01L 29/66* (2006.01)
*H01L 29/45* (2006.01)
*H01L 29/49* (2006.01)

(52) U.S. Cl.
CPC ...... *H01L 29/7813* (2013.01); *H01L 29/66719* (2013.01); *H01L 29/66734* (2013.01); *H01L 29/456* (2013.01); *H01L 29/4933* (2013.01)
USPC .......... 438/270; 257/330; 257/331; 257/332; 257/333; 257/334

(58) Field of Classification Search
None
See application file for complete search history.

(56) References Cited

U.S. PATENT DOCUMENTS

| | | | | |
|---|---|---|---|---|
| 5,027,185 A | * | 6/1991 | Liauh | 257/413 |
| 6,489,204 B1 | * | 12/2002 | Tsui | 438/270 |
| 6,841,830 B2 | * | 1/2005 | Liu et al. | 257/368 |
| 2003/0168695 A1 | * | 9/2003 | Sodhi et al. | 257/328 |

* cited by examiner

*Primary Examiner* — Matthew W Such
*Assistant Examiner* — Robert Carpenter
(74) *Attorney, Agent, or Firm* — Li & Cai Intellectual Property (USA) Office

(57) ABSTRACT

A fabrication method of a high cell density trench power MOSFET structure is provided. Form at least a gate trench in a silicon substrate and a gate dielectric layer on the silicon substrate. Form a gate polysilicon structure in the gate trench and cover by a passivation layer. Form a first-conductive-type body region in the silicon substrate and implant impurities with a second conductive type thereof to form a source doped region. Expose the gate polysilicon structure and the source doped region. Form a dielectric spacer having a predetermined thickness on a sidewall of the gate trench. Deposit metal on the gate polysilicon structure and the source doped region. A first and a second self-aligned silicide layer are respectively formed on the gate polysilicon structure and the source doped region. The dielectric spacer forms an appropriate distance between the first and the second self-aligned silicide layer.

5 Claims, 4 Drawing Sheets

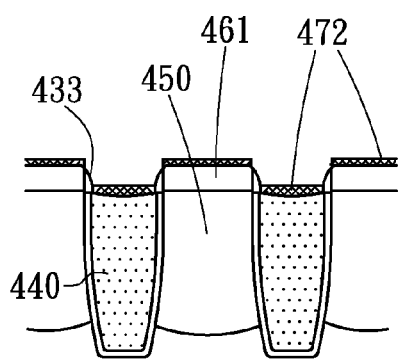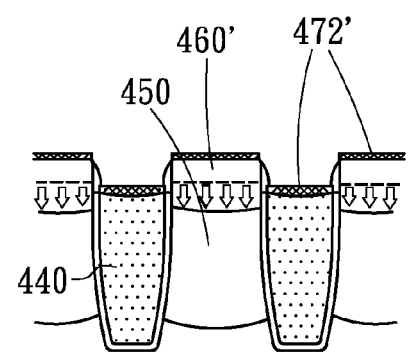
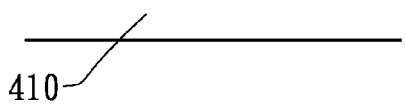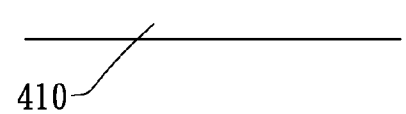
Fig. 4A        Fig. 4B

TRENCH POWER MOSFET STRUCTURE WITH HIGH CELL DENSITY AND FABRICATION METHOD THEREOF

BACKGROUND OF THE INVENTION (1) Field of the Invention

The present invention relates to a power MOSFET structure and fabrication method thereof, and in particular, to a trench power MOSFET structure and fabrication method thereof.

(2) Description of the Prior Art

FIG. 1A to FIG. 1C schematically illustrates selected steps of the fabrication method for a traditional power MOSFET. An N-type power MOSFET is used as an example in the following. Referring to FIG. 1A, first, an N-type silicon substrate 110 is provided. Then, a mask is utilized to define the position of the gate trenches 120 wherein the gate trenches 120 are formed in the silicon substrate 110 through etching. Next, a gate dielectric layer 130 is formed on the exposed surfaces of the N-type silicon substrate 110. Thereafter, a polysilicon layer is deposited on the gate dielectric layer 130 and the gate trenches 120 are each filled with the polysilicon layer. Then, a portion of the polysilicon layer on the N-type silicon substrate 110 is etched back to form a polysilicon gate structure 140.

Next, referring to FIG. 1B, a passivation layer 131 is formed on the polysilicon gate structure 140. A blanket ion implantation method is utilized to implant the P-type impurities in the N-type silicon substrate 110 to form a heavy doped region (not shown in the figure). Then, referring to FIG. 1C, a thermal drive-in process is performed to have the implanted P-type impurities diffused downward forming a P-type body region 150 in the N-type silicon substrate 110. Afterward, the N-type impurities are implanted in the P-type body region 150 and another thermal drive-in process is applied to form a source doped region 160.

In order to improve device integration by shrinking the dimension of the MOSFET, the width of the gate trench 120 and source doped region 160 must be further reduced. However, as the width of the gate trench 120 is reduced, the gate impedance of the polysilicon gate 140 would be greatly increased. Relatively, the switch speed of the transistor would be negatively impacted as the switching loss would increase. As the width of the source doped region 160 shrinks, the conductive resistance of the source doped region 160 would increase causing the conduction loss to increase as well. Consequently, how to effectively improve the trench power MOSFET structure to have low gate impedance and low conductive resistance (Rds (ON)) becomes an urgent issue in the art to be resolved.

Therefore, fabricating a trench power MOSFET structure with high cell density and low conductive resistance is an important topic in the industry

SUMMARY OF THE INVENTION

Accordingly, a main objective of the present invention is to provide a trench power MOSFET structure with high cell density and the fabrication method thereof, in which the gate impedance and the on resistance can be reduced efficiently so as to further shrink the dimension of transistor.

To achieve the above-mentioned objective, the present invention provides a fabrication method of a trench power MOSFET structure with high cell density including at least the following steps. Firstly, at least a gate trench is formed in a silicon substrate. Then, a gate dielectric layer is formed on the exposed surface of the silicon substrate. A gate polysilicon structure is formed in the gate trench. A passivation layer is formed in the gate trench to cover the gate polysilicon structure. A body region having a first conductive type is formed in the silicon substrate. Afterward, a source doped region is formed by implanting impurities of a second conductive type into the body region. Then, a portion of the gate dielectric layer and the passivation layer are removed to expose the gate polysilicon structure and the source doped region. Subsequently, a dielectric spacer is formed with a predetermined thickness on a sidewall of the gate trench. A metal is deposited on the surface of the gate polysilicon structure and the source doped region. Then after a thermal process a first self-aligned silicide layer is formed on the surface of the gate polysilicon structure and the second self-aligned silicide layer is formed on the surface of the source doped region. A dielectric structure is formed in the gate trench to shield the first self-aligned silicide layer. Lastly, a source metal layer is formed on the dielectric structure and the second self-aligned silicide layer. The dielectric spacer is used for forming an appropriate distance between the first self-aligned silicide layer and the second self-aligned silicide layer.

The present invention also provides a trench power MOSFET structure with high cell density according to abovementioned method. The trench power MOSFET structure has a silicon substrate and a plurality of gate trenches located in the silicon substrate. Each gate trench has a gate dielectric layer lining in the inner surface thereof. A gate polysilicon structure having a predetermined distance between an upper surface thereof and an opening of the respective gate trench is located in the respective gate trench. A body region is located between the adjacent gate trenches. A source doped region is located in an upper surface of the body region. A dielectric spacer is located on the gate polysilicon structure to cover a sidewall of the respective gate trench. A first self-aligned silicide layer is located on the upper surface of the gate polysilicon layer. A second self-aligned silicide layer is located on an upper surface of the source doped region. A dielectric structure fills the respective gate trench to shield the first self-aligned silicide layer. A source metal layer is electrically coupled to the source doped region through the second self-aligned silicide layer.

In order to make the aforementioned and other objectives, features and advantages of the present invention comprehensible, preferred embodiments accompanied with figures are described in detail below.

BRIEF DESCRIPTION OF THE DRAWINGS

The present invention will now be specified with reference to its preferred embodiments illustrated in the following drawings, in which:

FIG. 4A to FIG. 4B schematically illustrates a fabrication method for the trench power MOSFET structure according to a third embodiment of the present invention.

DESCRIPTION OF THE PREFERRED EMBODIMENT

The technological feature of the present invention is to utilize the self-alignment metal silicide (salicide) process to form the metal silicide both on the surface of the gate polysilicon structure in the gate trench and on the surface of the source doped region. It can improve the increasing issue of the gate impedance and the on resistance associated with the transistor when shrinking the width of the gate trench and source doped region. This is an important topic for the deep submicron device. Since the contact resistance and the contact area are inversely proportional to each other, the contact resistance would increase as the device shrinks, thereby may have impact on the driven capability of the device. Therefore, the present invention can be utilized to shrink the dimension of device so as to increase the device integration. In addition, it can also save the area occupied by the device in a layout, hence lower the parasitic capacitance thus improve high frequency operating characteristics.

Figure 1A:
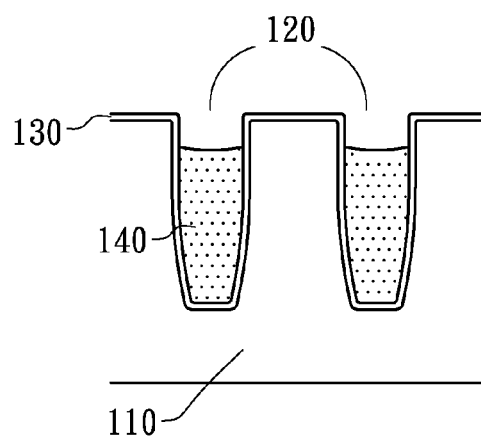
FIG. 1A to FIG. 1C schematically illustrates selected steps of the fabrication method of a traditional power MOSFET.
Figure 1B:
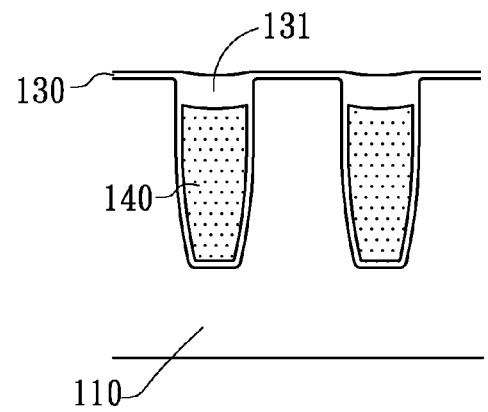
Figure 1C:
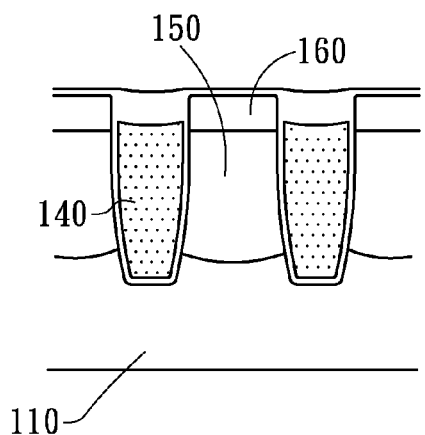
Figure 2A:
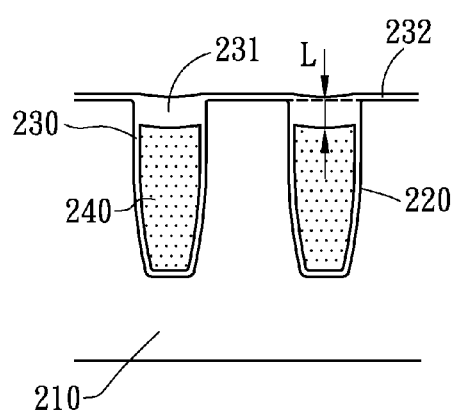
FIG. 2A to FIG. 2E schematically illustrates a fabrication method for the trench power MOSFET structure according to a first embodiment of the present invention.

FIG. 2A to FIG. 2E schematically illustrates a fabrication method of the trench power MOSFET structure according to a first embodiment of the present invention. Referring to FIG. 2A, gate trenches 220 are formed in a silicon substrate 210. Afterward, a gate dielectric layer 230 is formed to line the exposed surfaces of a silicon substrate 210 which include an inner surface of the gate trench 220 and an upper surface of the silicon substrate 210. The gate dielectric layer 230 can be substituted using other insulating material. Thereafter, a gate polysilicon layer is formed on the gate dielectric layer 230 and in the gate trench 220. Then, the gate polysilicon layer on the silicon substrate 210 and a portion of the gate polysilicon layer in the gate trench 220 are removed to form a gate polysilicon structure 240 in the gate trench 220, wherein a predetermined distance L is kept between the upper surface of the gate polysilicon structure 240 and an opening of the gate trench 220 (the dotted line in FIG. 2A). This predetermined distance L is for example in the rage of 1000~3000 angstrom (Å), for example. Thereafter, a passivation layer 231 is formed on the gate polysilicon structure 240 and the silicon substrate 210, further the unnecessary portion of the passivation layer 231 and the gate dielectric layer 230 on the silicon substrate 210 are removed, such that only the passivation layer 231 having sufficient thickness is remained on the gate polysilicon structure 240. For a preferable embodiment, the passivation layer 231 may composed of silicon oxide and the unnecessary portion of the passivation layer 231 and gate dielectric layer 230 can be removed by directly using the etching back process.

Next, a diffusion barrier layer 232 is formed on the passivation layer 231 and the silicon substrate 210 so as to prevent the pollution of the implanted impurities in the later step of implanting impurities. The thickness of the diffusion barrier layer 232 is in the range of 200~300 (Å). The gate dielectric layer 230, passivation layer 231, and diffusion barrier layer 232 may for example composed of an identical material.

Figure 2B:
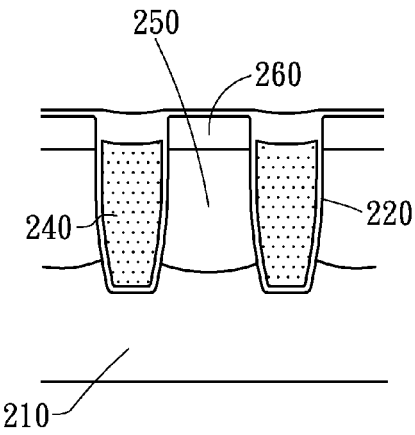

Then, referring to FIG. 2B, the impurities with a first conductive type are implanted into the silicon substrate 210 to form a doped region. Then, a thermal drive-in process is applied to diffuse the impurities of a first conductive type in the doped region. During the drive-in process, the impurities in the doped region diffuse downward to form a body region 250. Thereafter, the impurities of a second conductive type are implanted into the body region 250, with another thermal drive-in process applied to form a source doped region 260 in the upper portion of the silicon substrate 210. It is shall be noted that, the bottom of the source doped region 260 should be lower than the upper surface of the gate polysilicon structure 240.

Figure 2C:
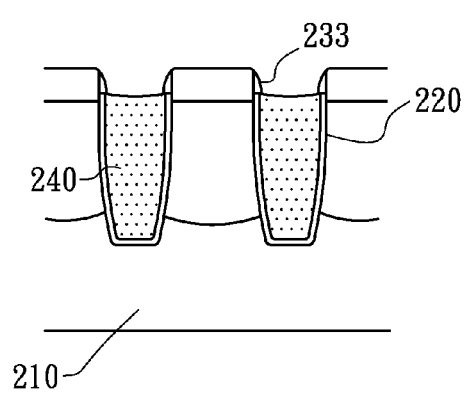

Referring to FIG. 2C, the passivation layer 231 and diffusion barrier layer 232 are removed to have the gate polysilicon structure 240 and the upper surface of the silicon substrate 210 exposed. Afterward, a dielectric spacer 233 is formed on the exposed sidewall of the gate trench 220. The thickness of the dielectric spacer 233 is approximate in the range of 700~3000 (Å) for preventing a first self-aligned silicide layer and a second self-aligned silicide layer (formed in the later step) to be in contact with each other causing damage to the trench power MOSFET structure as the dimension of the trench power MOSFET structure further shrinks. For a preferable example, the thickness of the dielectric spacer 233 is larger than the thickness of the gate dielectric layer 230.

Figure 2D:
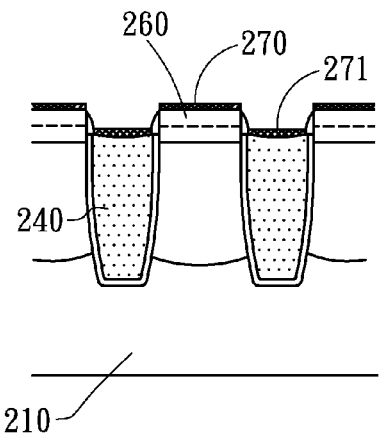

Referring to FIG. 2D, a metal layer is deposited on the source doped region 260 and the gate polysilicon structure 240. A first rapid thermal annealing (RTA) process is then applied with the temperature rises to approximate 760° C. The silicon atoms in the source doped region 260 and the gate polysilicon structure 240 react with the metal atoms in the metal layer on the respective interface to form the silicide. Relatively, the source doped region 260 which is lined by the dielectric spacer 233 does not react with the metal layer. Consequently, this is a self-aligned step. Afterward, the selectively etching step is utilized for removing the unreacted metal layer to leave a metal silicide layer 270 and a gate metal silicide layer 271 respectively formed on the source doped region 260 and gate polysilicon structure 240. A selectively second RTA process can be utilized for further reducing the resistance of metal silicide, in which, the temperature may rise to approximate 850° C. The above-mentioned metal layer generally composes of Ti(TiN), Co, Ni, or the mixtures selected from the aforementioned materials as well as other metal materials depending on the requirement. A vertical distance between the surface of the gate metal silicide layer 271 and the metal silicide layer 270 is better to be greater than half of the thickness of the source doped region 260 (as shown by the dotted line) to avoid having the metal silicide layer 270 in contact with the gate metal silicide layer 271. The salicide process can be utilized to form the metal silicide layer on the gate polysilicon structure 240 and source doped region 260 to effectively reduce the contact resistance and further to enhance the driven capability of the device.

Figure 2E:
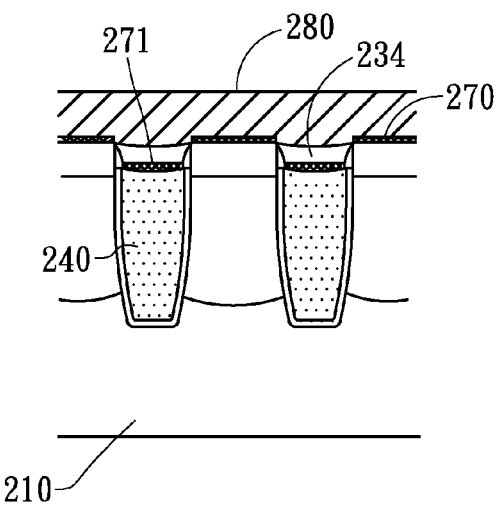

Thereafter, referring to FIG. 2E, a dielectric structure 234 with a proper thickness is formed on the gate metal silicide layer 271. Lastly, a source metal layer 280 is deposited on the dielectric structure 234 and the metal silicide layer 270 for electrically connecting the source doped region 260. For a preferable embodiment, the surface of the dielectric structure 234 is close to the surface of the silicon substrate 210 to ensure the whole upper surface of the metal silicide layer 270 completely in contact with the source metal layer 280. In the instant embodiment, the whole dielectric spacer 233 is covered by the dielectric structure 234, however, the present invention is not limited thereto. For example, there may be only a portion of the dielectric spacer 233 being covered by the dielectric structure 234.

Figure 3A:
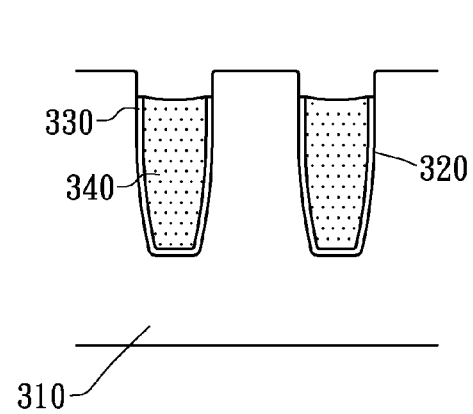
FIG. 3A to FIG. 3B schematically illustrates a fabrication method for the trench power MOSFET structure according to a second embodiment of the present invention.
Figure 3B:
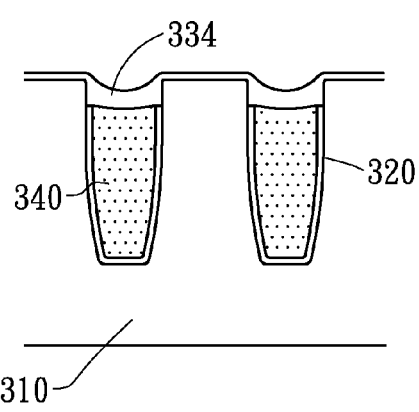

FIG. 3A to FIG. 3B schematically illustrates a fabrication method of the trench power MOSFET structure according to a second embodiment of the present invention. The difference between the second embodiment and the first embodiment is shown in the FIG. 3A. Referring to FIG. 3A, after the step of forming a gate polysilicon structure 340, remove a gate dielectric layer 330 on the surface of a silicon substrate 310 and a portion of the gate dielectric layer 330 in a gate trench 320. Then, as shown in FIG. 3B, a passivation layer 334 is formed on the gate polysilicon structure 340 and the silicon substrate 310. Since the impurity density of the gate polysilicon structure 340 is larger than the impurity density of the silicon substrate 310, consequently, during the formation of the passivation layer 334, the growth rate of the passivation layer 334 on the gate polysilicon structure 340 is higher than the growth rate of the passivation layer 334 on the silicon substrate 310. Therefore, the passivation layer 334 on the gate polysilicon structure 340 has sufficient thickness to prevent the impurities implanted into gate polysilicon structure 340 in the later step of forming the source doped region. In addition, it can also prevent impurities of the source doped region from diffusing into the gate polysilicon structure 340 through the sidewall of the gate trench 320. The rest of the steps in the instant embodiment are essential the same as the steps described in the first embodiment, further descriptions are hereby omitted.

FIG. 4A to FIG. 4B schematically illustrates a fabrication method of the trench power MOSFET structure according to a third embodiment of the present invention. The difference between the third embodiment and the first embodiment is in the thermal drive-in step for forming the source doped region. The thermal drive-in step in the instant embodiment is delayed and to be completed with the RTA step of forming the metal silicide. Referring to FIG. 4A, after the formation of a body region 450, the impurities of a second conductive type are implanted into the body region 450 to form a second conductive type doped region 461. Next, a portion of the gate dielectric layer and the passivation layer are removed and the upper surface of the gate polysilicon structure 440 is exposed. Afterward, a dielectric spacer 433 is formed on the exposed sidewall of the gate trench. Then, a metal layer 472 is deposited on the gate polysilicon structure 440 and the second conductive type doped region 461. As shown in FIG. 4B, the RTA process is further applied to form a source doped region 460' and a metal silicide layer 472' simultaneously. The rest of the steps in the present embodiment are essentially the same as the steps described in the first embodiment, and further descriptions are hereby omitted.

While the preferable embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a trench power MOSFET structure with a cell density comprising the steps of:
    forming at least a gate trench in a silicon substrate;
    forming a gate dielectric layer lining exposed surfaces of the silicon substrate;
    forming a gate polysilicon structure in the gate trench;
    forming a passivation layer in the gate trench to cover the gate polysilicon structure;
    forming a diffusion barrier layer on the passivation layer and on the surfaces of the silicon substrate after the step of forming the passivation layer in the gate trench, wherein a thickness of the diffusion barrier layer is in the range of 200-300 Å;
    forming a body region having a first conductive type in the silicon substrate;
    forming a source doped region by implanting impurities of a second conductive type into the body region;
    removing a portion of the gate dielectric layer and the passivation layer so as to expose the gate polysilicon structure and the source doped region;
    forming a dielectric spacer with a predetermined thickness on a sidewall of the gate trench;
    depositing a metal layer on the exposed surfaces of the gate polysilicon structure and the source doped region;
    forming a first self-aligned silicide layer on the gate polysilicon structure and a second self-aligned silicide layer on the source doped region by using a thermal process;
    forming a dielectric structure in the gate trench to shield the first self-aligned silicide layer; and
    forming a source metal layer on the dielectric structure and the second self-aligned silicide layer.

2. The fabrication method of the trench power MOSFET structure with a cell density of claim 1, wherein after the step of implanting the impurities of the second conductive type into the body region, further comprises a step of applying a thermal drive-in process to the source doped region.

3. The fabrication method of the trench power MOSFET structure with a cell density of claim 1, wherein a vertical distance between an upper surface of the first self-aligned silicide layer and an upper surface of the second self-aligned silicide layer is larger than half depth of the source doped region.

4. The fabrication method of the trench power MOSFET structure with a cell density of claim 1, wherein the gate dielectric layer, the passivation layer, the dielectric spacer, and the dielectric structure are composed of an identical material.

5. The fabrication method of the trench power MOSFET structure with a cell density of claim 1, wherein the step of removing a portion of the gate dielectric layer and the passivation layer to expose the gate polysilicon structure and the source doped region comprises: removing a portion of the gate dielectric layer to expose the sidewall of the gate trench and the silicon substrate prior to the step of forming the passivation layer in the gate trench.

* * * * *